(12) United States Patent
Golovanov

(10) Patent No.: US 12,169,229 B2
(45) Date of Patent: Dec. 17, 2024

(54) ILLUMINATION INSERT FOR AN NMR SPECTROMETER

(71) Applicant: The University of Manchester, Manchester (GB)

(72) Inventor: Alexander Golovanov, Manchester (GB)

(73) Assignee: THE UNIVERSITY OF MANCHESTER, Greater Manchester (GB)

( * ) Notice: Subject to any disclaimer, the term of this patent is extended or adjusted under 35 U.S.C. 154(b) by 97 days.

(21) Appl. No.: 18/000,505

(22) PCT Filed: May 21, 2021

(86) PCT No.: PCT/GB2021/051254
§ 371 (c)(1),
(2) Date: Dec. 1, 2022

(87) PCT Pub. No.: WO2021/250372
PCT Pub. Date: Dec. 16, 2021

(65) Prior Publication Data
US 2023/0213600 A1     Jul. 6, 2023

(30) Foreign Application Priority Data

Jun. 10, 2020 (GB) .................................... 2008825

(51) Int. Cl.
*G01R 33/30* (2006.01)
*G01R 33/46* (2006.01)
(52) U.S. Cl.
CPC ............. *G01R 33/30* (2013.01); *G01R 33/46* (2013.01)

(58) Field of Classification Search
CPC ................................ G01R 33/30; G01R 33/46
See application file for complete search history.

(56) References Cited

U.S. PATENT DOCUMENTS

| 8,508,222 B2 * | 8/2013 | Albu ..................... G01R 33/282 250/251 |
| 9,063,060 B2 * | 6/2015 | Inukai ..................... G01R 33/30 |
| 11,156,681 B2 * | 10/2021 | Endo ..................... G01R 33/307 |

FOREIGN PATENT DOCUMENTS

EP     3608684 A1     2/2020

OTHER PUBLICATIONS

International Preliminary Report on Patentability for Int'l Application No. PCT/GB2021/051254, Date of Issuance: Dec. 13, 2022.
Nagashima, T., et al., "Structure-Correlation NMR Spectroscopy for Macromolecules Using Repeated Bidirectional Photoisomerization of Azobenzene," Anal. Chem. 87(22): 11544-11552 (Nov. 17, 2015).

(Continued)

*Primary Examiner* — Gregory H Curran
(74) *Attorney, Agent, or Firm* — Hamilton, Brook, Smith & Reynolds, P.C.

(57) ABSTRACT

An illumination insert for an NMR spectrometer, the illumination insert being shaped to receive a sample and comprising a light guide portion for guiding light from a light source, and a diffuser portion for diffusing light received from the light guide portion towards a sample received in the illumination insert.

27 Claims, 5 Drawing Sheets

(56) References Cited

OTHER PUBLICATIONS

Feldmeier, C., et al., "LED based NMR illumination device for mechanistic studies on photochemical reactions—Versatile and simple, yet surprisingly powerful," Journal of Magnetic Resonance, (232)39-44 (Apr. 2013).
Nitschke, Ph., et al., "Combination of illumination and high resolution NMR spectroscopy: Key features and practical aspects, photochemical applications, and new concepts," Progress in Nuclear Magnetic Resonance Spectroscopy, 114-115: 86-134 (Jun. 5, 2019).
Seegerer, A., et al., "Combined In Situ Illumination-NMR-UV/Vis Spectroscopy: A New Mechanistic Tool in Photochemistry," Chem. Int. Ed. 57: 7493 (2018).
Search Report for Great Britain Application No. 2008825.8, dated Mar. 8, 2021.
International Search Report and Written Opinion for PCT/GB2021/051254, dated Aug. 31, 2021.

* cited by examiner

ILLUMINATION INSERT FOR AN NMR SPECTROMETER

This application is the U.S. National Stage of International Application No. PCT/GB2021/051254, filed May 21, 2021, which designates the U.S., published in English, and claims priority under 35 U.S.C. § 119 or 365 (c) to Great Britain Application No. 2008825.8, filed Jun. 10, 2020. The entire teachings of the above applications are incorporated herein by reference.

The present invention relates to an illumination insert, and in particular to an illumination insert for use in an NMR spectrometer.

BACKGROUND

Nuclear magnetic resonance (NMR) spectroscopy is an established and very powerful technique for chemical characterisation of substances, including structures of large and small biomolecules, and chemical products. It accurately reflects and reports on the in situ composition of samples, and therefore can be used to monitor the progress of chemical reactions, and conformational changes. Recently, it has been widely recognised that many chemical and enzymatic reactions are modulated with light. Sample illumination during NMR experiments can also dramatically increase the sensitivity of such experiments. Therefore, the combination of illumination and high-resolution NMR spectroscopy has been recently recognised as an exciting emerging technique.

Existing NMR spectrometers with illumination capability include systems that utilise optical fibre to guide light (from a laser or light-emitting diode (LED)) into an area just above the sample to be studied. This leads to significantly non-uniform light intensity distribution about the sample (e.g. one side is illuminated whilst the other is not). In some known arrangements, the optical fibre extends into the sample itself, but this leads to magnetic field distortion and difficulties in sample shimming and solvent signal suppression, as well as possible sample contamination, and, again, non-uniform light distribution. In some prior art devices, a combination of optical fibers and glass coaxial inserts are used, wherein the glass coaxial insert extends into the sample to be studied. Arrangements such as these result in field inhomogeneity, and for cryoprobes, a reduction in experimental sensitivity (i.e., a reduction in signal-to-noise ratio). In general, the use of optical fibre dramatically reduces the intensity of light which can reach the sample. Additionally, it is challenging to use optical fibre with sealed or pre-sealed samples (e.g. oxygen sensitive samples).

Due to the geometry of NMR spectrometers (and the bores of NMR spectrometers that samples are usually loaded into), it is often difficult to provide light to a sample in a manner that doesn't adversely affect the magnetic field within the NMR spectrometer.

Furthermore, certain known arrangements are difficult to make optical adjustments to in situ, and do not lend themselves to providing convenient selection of different irradiation frequencies or combinations thereof.

One known prior art system is described in EP3608684A1 (Technische Universität Graz) in which an insert device is provided that comprises a non-magnetic carrying structure that includes a cavity for hosting radiofrequency coils and a sample. Light sources are arranged within corresponding openings of the carrying structure facing the sample to provide illumination. Reflective material is arranged on the inside of the carrying structure to reflect light towards the sample.

It is an object of certain embodiments of the present invention to overcome certain disadvantages associated with the prior art.

BRIEF SUMMARY OF THE DISCLOSURE

In accordance with an aspect of the present invention there is provided an illumination insert for an NMR spectrometer, the illumination insert being shaped to receive a sample and comprising:
a light guide portion for guiding light from a light source; and
a diffuser portion for diffusing light received from the light guide portion towards a sample received in the illumination insert.

In certain embodiments, the illumination insert comprises a main body, wherein the main body comprises the light guide portion and the diffuser portion. The main body may be a unitary component. The main body may be a tube having an open end, a closed end and a bore in which the sample may be received. The illumination insert may comprise a cap which seals the open end of the tube, wherein optionally the cap is transparent.

In certain embodiments, the illumination insert may be shaped to receive a sample holder, wherein the sample holder may contain a sample. The main body may be a tube having a first open end, a second open end and a through bore therethrough, wherein the sample holder may be received within the through bore. In certain embodiments, the diffuser portion may be positionable proximate to radiofrequency coils of an NMR spectrometer. In certain embodiments, the radiofrequency coils may be disposed radially outward of the tube, proximate the diffuser portion.

In certain embodiments, the illumination insert may comprise a housing that houses at least part of the light guide portion or the diffuser portion. The housing may comprise a non-magnetic material, optionally wherein the non-magnetic material is aluminium or copper. In certain embodiments, the housing may be configured to locate the illumination insert in the NMR spectrometer.

In certain embodiments, the main body may comprise a reflective coating for improving internal reflection in the main body.

In certain embodiments, the illumination insert may further comprise one or more light sources for providing light to the light guide portion. The one or more light sources may comprise one or more of a light emitting diode, a laser, or a laser diode.

In certain embodiments, the illumination insert may comprise an auxiliary light guide for guiding light from a remote light source towards the light guide portion.

The illumination insert may comprise one or more intermediate light transmission components for facilitating transmission of light to the light guide portion. The one or more intermediate light transmission components may focus light towards the light guide portion.

The illumination insert may comprise one or more reflectors for reflecting light towards the light guide portion.

In certain embodiments, the diffuser portion may comprise a plurality of light scattering centres that scatter light so as to collectively diffuse light received from the light guide portion towards a sample received in the illumination insert. The plurality of light scattering centres may be provided within the diffuser portion or on a surface of the diffuser portion. In certain embodiments, the plurality of light scattering centres may comprise a plurality of defects, optionally wherein the plurality of defects comprise a plurality of grooves, indents and/or scratches. In certain embodiments, the plurality of light scattering centres may be distributed non-uniformly in and/or on the diffuser portion.

In certain embodiments, the illumination insert may comprise a heat sink for facilitating the transfer of heat away from the light source. The heat sink may be a dedicated component, or for example, another component having multiple functions (e.g. the housing may act as a heat sink). The heat sink may serve to facilitate the transfer of heat out of the illumination insert, e.g. into the magnet bore of the NMR spectrometer that the illumination insert is inserted into. The airflow in the magnet bore may assist in transferring the heat away from the illumination insert. Additionally or alternatively, additional airflow means may be provided for providing an airflow that facilitates the removal of heat from the illumination insert.

In accordance with another aspect of the present invention, there is provided an NMR probehead housing comprising an illumination insert, the illumination insert comprising a main body in the form of a tube having a first open end, a second open end and a through bore therethrough, wherein a sample holder may be received within the through bore, and the main body comprises:

a light guide portion for guiding light from a light source; and a diffuser portion for diffusing light received from the light guide portion towards a sample received in the illumination insert.

The NMR probehead housing may comprise radiofrequency coils disposed radially outward of the tube. In certain embodiments, the radiofrequency coils may be disposed proximate to the diffuser portion.

In certain embodiments, the NMR probehead housing may comprise a sample holder received within the through bore and radiofrequency coils disposed between the tube and the sample holder, proximate the diffuser portion.

In accordance with another aspect of the present invention, there is provided an NMR spectrometer comprising an illumination insert as described above or an NMR probehead housing as described above.

BRIEF DESCRIPTION OF THE DRAWINGS

Embodiments of the invention are further described hereinafter with reference to the accompanying drawings, in which.

DETAILED DESCRIPTION

Figure 1:
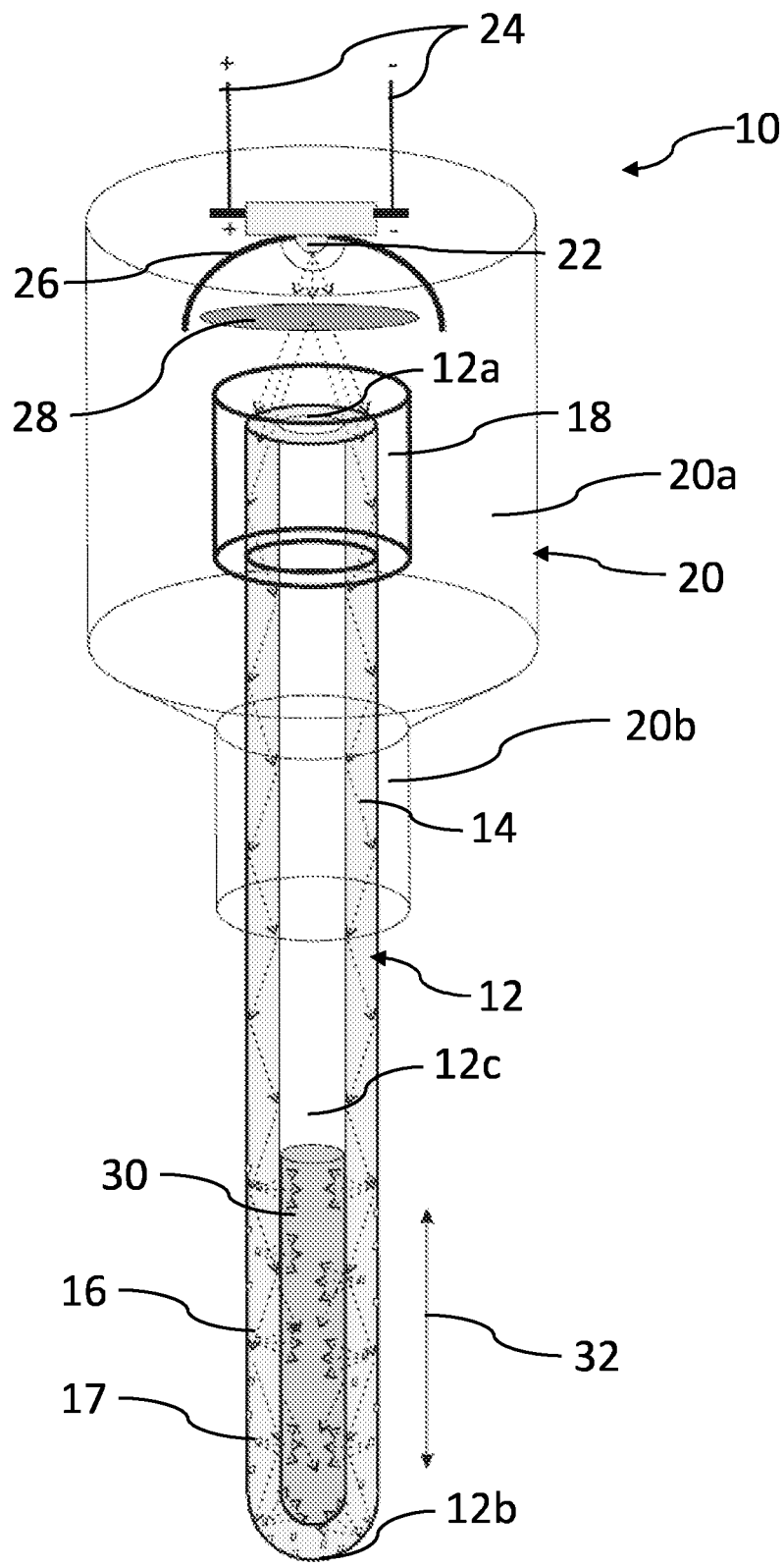
FIG. 1 shows an illumination insert in accordance with an embodiment of the present invention.

An illumination insert 10 in accordance with an embodiment of the present invention is shown in FIG. 1. The illumination insert 10 is configured for insertion in a nuclear magnetic resonance (NMR) spectrometer (not shown in FIG. 1). The illumination insert 10 serves to provide illumination to a sample contained within the illumination insert 10, when the illumination insert 10 is received in an NMR spectrometer. The sample may therefore be illuminated whilst being subjected to a magnetic field and radio waves produced by radiofrequency coils within the NMR spectrometer. The illumination may serve to increase the sensitivity of NMR characterization of the sample, and/or trigger chemical, structural or physical changes in the sample.

The illumination insert 10 comprises a main body 12 in the form of an elongate tube. The tube has an open end 12a, a closed end 12b and a (blind) bore 12c formed therein defining a volume for containing a sample 30 to be analysed by NMR spectroscopy. In certain embodiments, the sample 30 is a liquid.

The main body 12 has a light guide portion 14 and a diffuser portion 16. The light guide portion 14 is configured to guide light received from a light source 22 towards the diffuser portion 16. Whilst a single light source 22 is shown in the embodiment of FIG. 1, it will be appreciated that any embodiment may include any number of light sources, and the illustrated embodiments are not limiting in this respect. In certain embodiments, multiple light sources 22 may be provided in order to provide illumination of different wavelengths. In the embodiment shown in FIG. 1, light is guided from the light source 22 towards the diffuser portion 16 by total internal reflection of the light along walls of the tube 12 in the light guide portion 14. The walls of the tube 12 should be sufficiently thick and made of a suitably transparent material to enable such transmission therethrough and internal reflection therein. In certain embodiments, the tube 12 comprises glass, at least along the light guide portion 14.

The diffuser portion 16 is positioned towards the closed end 12b of the tube 12 such that it surrounds the sample 30 contained in the bore 12c (when the tube 12 is orientated such that the sample is disposed towards the closed end 12b of the tube 12 due to gravity). Throughout the Figures, example light paths are indicated by dotted arrows.

In the non-limiting embodiment shown in FIG. 1, the main body 12 is a unitary component. In alternative embodiments, the main body 12 may comprise more than one components, e.g. that are connected to one another, affixed to one another, or positioned relative to one another. However, the use of a unitary component will simplify the manufacture and assembly of the illumination insert 10, and will reduce optical losses between the light guide portion 14 and the diffuser portion 16.

The illumination insert 10 is positionable in an NMR spectrometer so that the sample 30 contained therein is located within an NMR detection region (indicated by reference numeral 32 in FIG. 1) of the NMR spectrometer, in proximity to radiofrequency coil or coils. The active volume 32 of the NMR spectrometer is the volume in which a magnetic field is present so that a sample 30 in the active volume 32 may be subjected to the magnetic field and radio waves and therefore studied using NMR spectroscopy. The radio waves may be created by one or more radiofrequency coils. The diffuser portion 16 is configured to diffuse light received from the light guide portion 14 towards the sample 30 received in the bore 12c. In doing so, the sample may be substantially uniformly illuminated by the light source 22 whilst being disposed within the NMR spectrometer. In preferable embodiments, the diffuser portion 16 is positioned within the coils of the NMR spectrometer (i.e. between the coils and the sample 30).

The diffuser portion 16 may be made of any suitable material and/or have a suitable geometry that permits light to be diffused towards the sample 30. In certain embodiments, this may be achieved by a plurality of light scattering centres 17 that scatter light so as to collectively diffuse light received from the light guide portion 14 towards a sample 30. For example, the plurality of light scattering centres 17 may be formed on an outer surface of the tube 12 along the diffuser portion 16 or within the material of the tube 12 itself. The plurality of light scattering centres 17 may comprise defects or imperfections, that may include one or more of indents, scratches, notches, surface roughening or any other suitable surface modification that gives rise to diffusion of light in that portion of the tube 12. The plurality of light scattering centres 17 may be non-uniformly distributed along the diffuser portion 16. In certain embodiments, the light guide portion 14 is substantially free of the light scattering centres that are provided on or in the diffuser portion 16.

The illumination insert 10 may be provided with a main body cap 18 which may close the open end 12a of the tube (main body) 12. The main body cap 12 may provide an air-tight seal on the tube 12 so as to seal the sample 30 in the bore 12c of the tube 12. The main body cap 18 may be sufficiently transparent to permit the transmission of light from the light source 22 to the light guide portion 14 of the tube 12. In certain embodiments, the main body cap 18 may be shaped so as to provide a degree of focussing to the light transmitting therethrough.

The light source 22 may be any suitable source of light. In certain embodiments, the light source 22 may provide a single or multiple wavelengths of light. In certain embodiments, the light source 22 may comprise a light emitting diode (LED), a laser diode or a laser. In certain embodiments, the light source 22 is made of substantially non-magnetic materials, such as non-magnetic LEDs that are currently commercially available. Such embodiments reduce the effect on the magnetic field produced by the NMR spectrometer. In certain embodiments, more than one light source 22 may be provided, and the multiple light sources 22 may not necessarily be identical to one another. In certain embodiments, multiple light sources 22 may be provided where each light source 22 is capable of providing a different frequency and/or intensity of light. The light sources 22 may be selectively controlled to provide the required duration, frequency and/or intensity of light. The light source 22 may be removable so as to facilitate swapping of light sources 22 as desired. In certain embodiments, the light sources 22 may be controlled (e.g. synchronised) with respect to the radiofrequency pulses of the NMR spectrometer.

In the embodiment shown in FIG. 1, the light source 22 is connected to a pair of electrical connectors 24 for providing electrical power to the light source 22. A reflector 26 is provided around the light source 22 and is configured to reflect light from the light source 22 towards the light guide portion 14, thus increasing the intensity of light transmitted through the light guide portion 14. Certain embodiments may not include a reflector 26.

In the non-limiting embodiment of FIG. 1, an intermediate light transmission component 28 is provided between the light source 22 and the light guide portion 14. The intermediate light transmission component 28 may serve to facilitate transmission of the light from the light source 22 to the light guide portion 14. In certain embodiments, the intermediate light transmission component 28 may provide some degree of focussing to the light passing from the light source 22 to the light guide portion 14. In certain embodiments, the intermediate light transmission component 28 may comprise one or more of a flat protective glass component, a lens, an axicon, an optical guide, a light tunnel or an optical fibre. In certain embodiments, the intermediate light transmission component 28 may additionally or alternatively provide a protective or barrier function. For example, the intermediate light transmission component 28 may protect the light source 22 from surrounding components, e.g. the main body cap 18, or, in embodiments where no main body cap 18 is present, the open end of the main body 12. In embodiments where no main body cap 18 is present, the intermediate light transmission component 28 may serve to cover and/or seal the open end of the main body 12. The intermediate light transmission component 28 may serve to prevent contamination or damage of the light source 22. In such embodiments, the intermediate light transmission component 28 may comprise a glass window (e.g. made of quartz glass).

The illumination insert 10 is provided with a housing 20 that houses part of the tube 12. In the embodiment shown in FIG. 1, the housing 20 houses a part of the light guide portion 14 and the main housing cap 18. Additionally, the housing 20 houses the light source 22, the reflector 26 and the intermediate light transmission component 28. In alternative embodiments, some or all of these components may be disposed outside of the housing 20. The housing of the embodiment of FIG. 1 comprises a first housing part 20a and a second housing part 20b. The first housing part 20a and the second housing part 20b may be parts of a unitary component. In other embodiments, they may be distinct components that are assembled together. The housing 20 has a generally cylindrical profile with the first housing part 20a having a larger diameter than the second housing part 20b (in alternative embodiments, the first housing part 20a and the second housing part 20b may have the same diameter, i.e. forming one cylindrical part). The first housing part 20a houses a part of the light guide portion 14, the main housing cap 18, the light source 22, the reflector 26 and the intermediate light transmission component 28. The second housing part 20b houses only part of the light guide portion 14. In alternative embodiments, other combinations of components may be contained by the first housing part 20a and/or the second housing part 20b. The housing 20 is axially-symmetric about its longitudinal axis such that the illumination insert 10 may be inserted into a bore of an NMR spectrometer in any rotational orientation (about the longitudinal axis). However, in certain embodiments, a specific rotational orientation may be desired, and the shape of the housing 20 may facilitate or provide a guide towards the correct orientation during insertion. In certain embodiments, the tube 12 may be moveable relative to the housing 20. The second housing part 20b may further serve to locate the illumination insert 10 in the NMR spectrometer and reduce lateral movement of the illumination insert 10 when inserted. The housing 20 may be releasably attachable to the tube 12 and/or light source 22, e.g. by a pair of cooperating screw threads, or a push-in fitting. In certain alternative embodiments, the housing 20 may not be cylindrical and/or axially-symmetric about its longitudinal axis.

The housing 20 may comprise a non-magnetic material such as aluminium, copper or a non-magnetic alloy. Such embodiments reduce the effect of the housing on the magnetic field produced by the NMR spectrometer, and may help to dissipate heat generated by the light source 22. That is, in some embodiments, the housing 20 may provide a heat sink for dissipating heat from the light source 22. In certain other embodiments, a separate heat sink may be provided. In certain embodiments, cooling of the illumination insert 10 and/or cooling of the heat sink may be achieved by using existing airflow in the magnet bore of the NMR spectrometer in which the illumination insert 10 is inserted. In certain embodiments an additional airflow means for cooling may be provided. In certain embodiments, the illumination insert 10 may include or be provided with means for measuring temperature (e.g. a thermistor or thermocouple) of the illumination insert 10 components, light source or heat sink.

In some embodiments, a housing may not be provided, at all. In such embodiments, the various components of the illumination insert 10 may be otherwise arranged relative to one another (and the NMR spectrometer).

The electrical connectors 24 may comprise wires or other elongate conductors that are connectable to a power source so as provide power to the light source 22. In certain embodiments, the electrical connectors 24 may comprise terminals to which wires or other conductors may connect to so as to connect the light source 22 to a power source. For example, the light source 22 may only be connected or connectable to a power source when the illumination insert 10 is inserted into the NMR spectrometer.

The energising of the electrical connectors 24 may be controlled by a control system. The control system may be the control system of the NMR spectrometer (or at least be communicably coupled thereto). For example, the light source 22 may be switched on and off in synchronisation with radiofrequency pulses of the NMR spectrometer.

Figure 2:
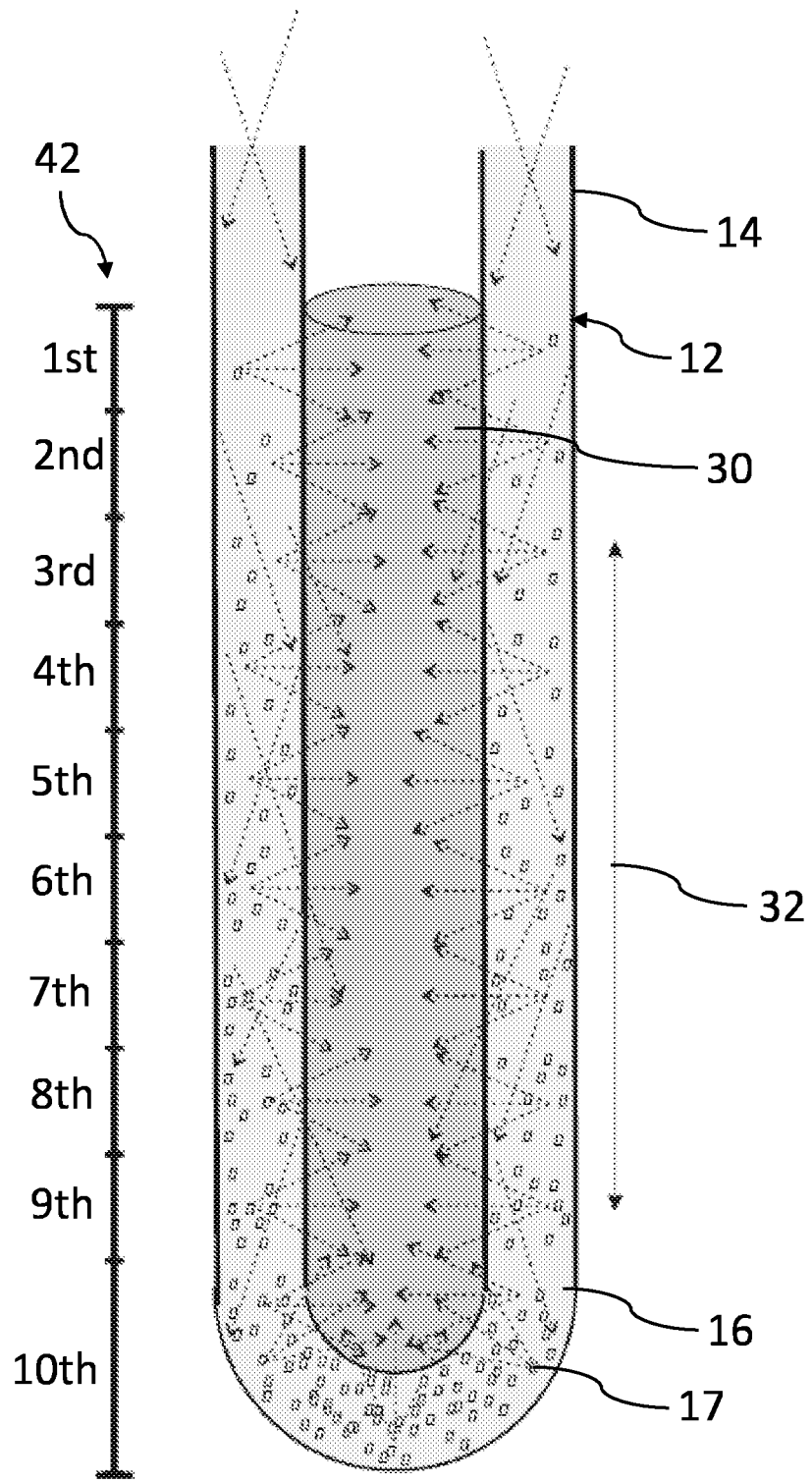
FIG. 2 shows a part of an illumination insert in accordance with an embodiment of the present invention.

Certain principles associated with embodiments of the present invention are described below with reference to FIG. 2. In particular, uniform illumination of a sample 30 may be achieved by non-uniform positioning of scattering centres (imperfections 17) inside the wall of the tube 12 or on the outer surface of the tube 12 around the sample 30. Light travels along the wall of the light guide portion 14 of the tube 12 without significant scattering until it enters the diffuser portion 16. To illustrate the principle, the sample area (i.e. the area adjacent the sample 30) can be divided, for convenience, into a number of short segments 42. FIG. 2 shows, as an example, ten segments 42, but this number can be larger or smaller, however the same principles will apply. For the ten segments 42 shown in FIG. 2, only $\frac{1}{10}$th of light that enters the sample area along the walls of the tube 12 is scattered in the 1st segment, with $\frac{9}{10}$th of light passing to further segments. The quantity and arrangement of scattering centres 17 present in the 1st segment should ensure that only this proportion of light is scattered there. Similarly, only a proportion ($\frac{1}{9}^{th}$) of remaining light should be scattered in the 2nd segment, with $\frac{1}{8}$th of the remaining light being scattered in the $3^{rd}$ segment, $\frac{1}{7}$th of the remaining light being scattered in the $4^{th}$ segment, $\frac{1}{6}^{th}$ of the remaining light being scattered in the $5^{th}$ segment, $\frac{1}{5}$th of the remaining light being scattered in the 6th segment, $\frac{1}{4}^{th}$ of the remaining light being scattered in the $7^{th}$ segment, $\frac{1}{3}^{rd}$ of the remaining light being scattered in the $8^{th}$ segment, $\frac{1}{2}$ of the remaining light being scattered in the $9^{th}$ segment, whereas the rest of light should be scattered by the last, 10th segment. The positioning and arrangement of these scattering centres 17, which is needed to obtain such a result, depends on a combination of factors, such as refraction index of glass used for the tube 12, the wall thickness of the tube 12, the angle at which light enters the tube 12, the optical properties of the sample 30 and the nature of the scattering centres 17 themselves. Therefore, those skilled in art can use the principles described above to optimise the positioning of the scattering centres 17 to match the chosen geometry of the tube 12, optical focussing system, and the light source 22. For example, for a given tube 12, circular grooves or scratches can be created on the outside surface of the tube 12, with non-uniform spacing between them. While manufacturing the tube 12, the positioning of such grooves or scratches may be guided by the measurement of the actual amount of the scattered light along the longitudinal axis of the tube 12 in the sample area, for example using photodetectors outside the sample 30, or by observing uniformity of fluorescence of the test sample 30 inside the tube 12, or by any other means available to those skilled in art.

Figure 3:
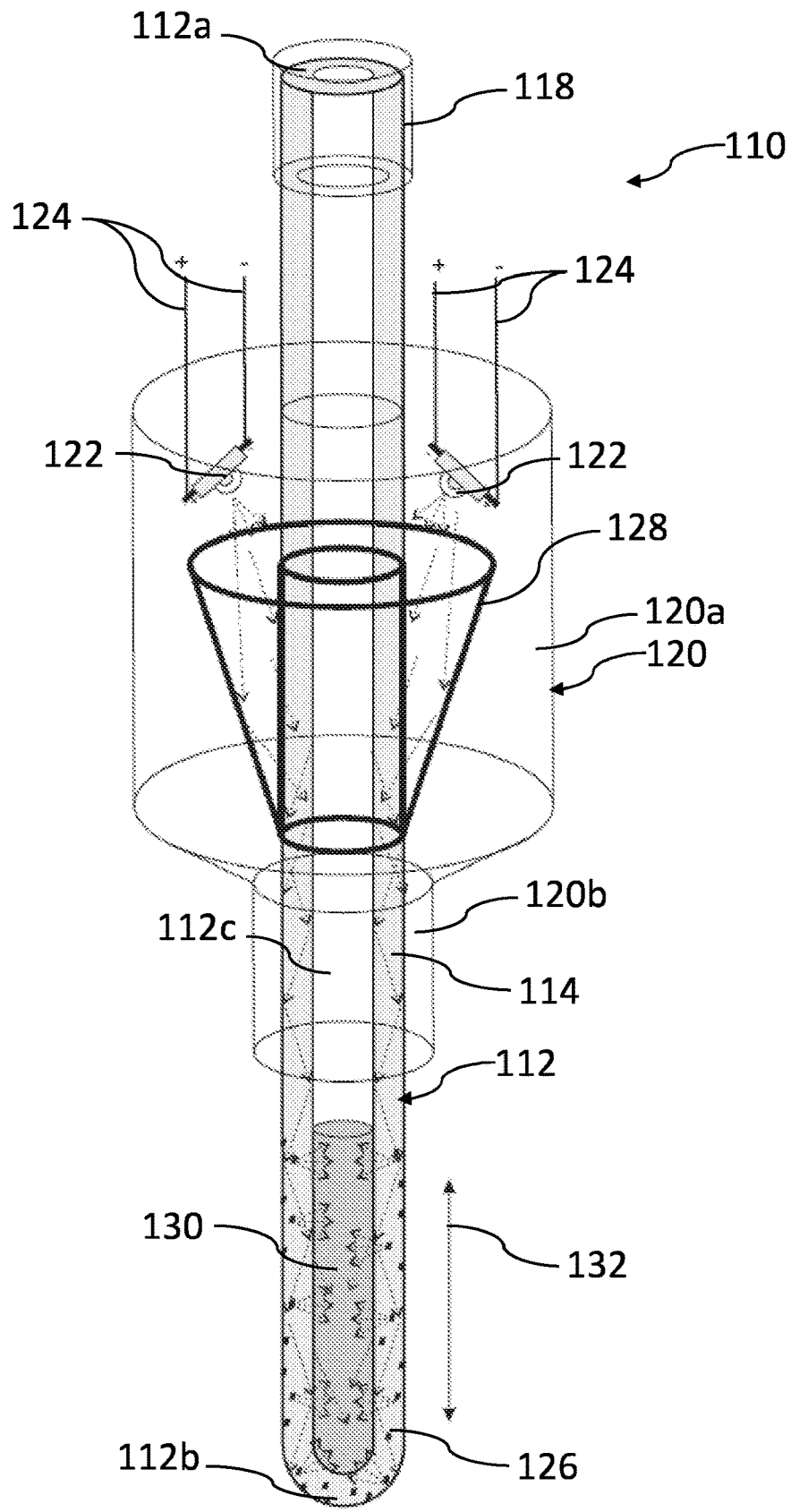
FIG. 3 shows an illumination insert in accordance with an alternative embodiment of the present invention.

An illumination insert 110 in accordance with an alternative embodiment of the present invention is shown in FIG. 3. The illumination insert 110 of FIG. 3 shares many features with the illumination insert 10 described above with reference to FIGS. 1 and 2. Like features are indicated using reference numerals transposed by 100.

The tube 112 of the illumination insert 110 of FIG. 3 extends entirely through the housing 120 so that each of the open end 112a and the closed end 112b are not housed within the housing 120.

The illumination insert 110 comprises two light sources 122 positioned around the tube 112. Thus, light enters the walls of the tube 112 through the outer surface of the tube 112 (as opposed to through the main body cap 18 and the top open end 12 of the tube 12 of FIG. 1). As such, a cap 118 covering the open end 112a does not need to be transparent. To facilitate the transmission of light into the walls of the tube 112 an intermediate light transmission component 128 is provided. In the non-limiting embodiment of FIG. 3, the intermediate light transmission component 128 comprises a funnel-shaped component. The funnel-shaped component is made of a transparent material with a refraction index matched to that of the tube 112. The funnel-shaped component is shaped so as to collect light from the light sources 122 and guide it to the walls of the tube 112 so that it may be transmitted in the walls of the tube 112. Optionally, the outer surface of the intermediate light transmission component 128 may comprise a reflective layer to improve the light-containing properties of the intermediate transmission component 128 and assist the internal reflection. In certain other embodiments, an independent reflector may be provided.

Figure 4:
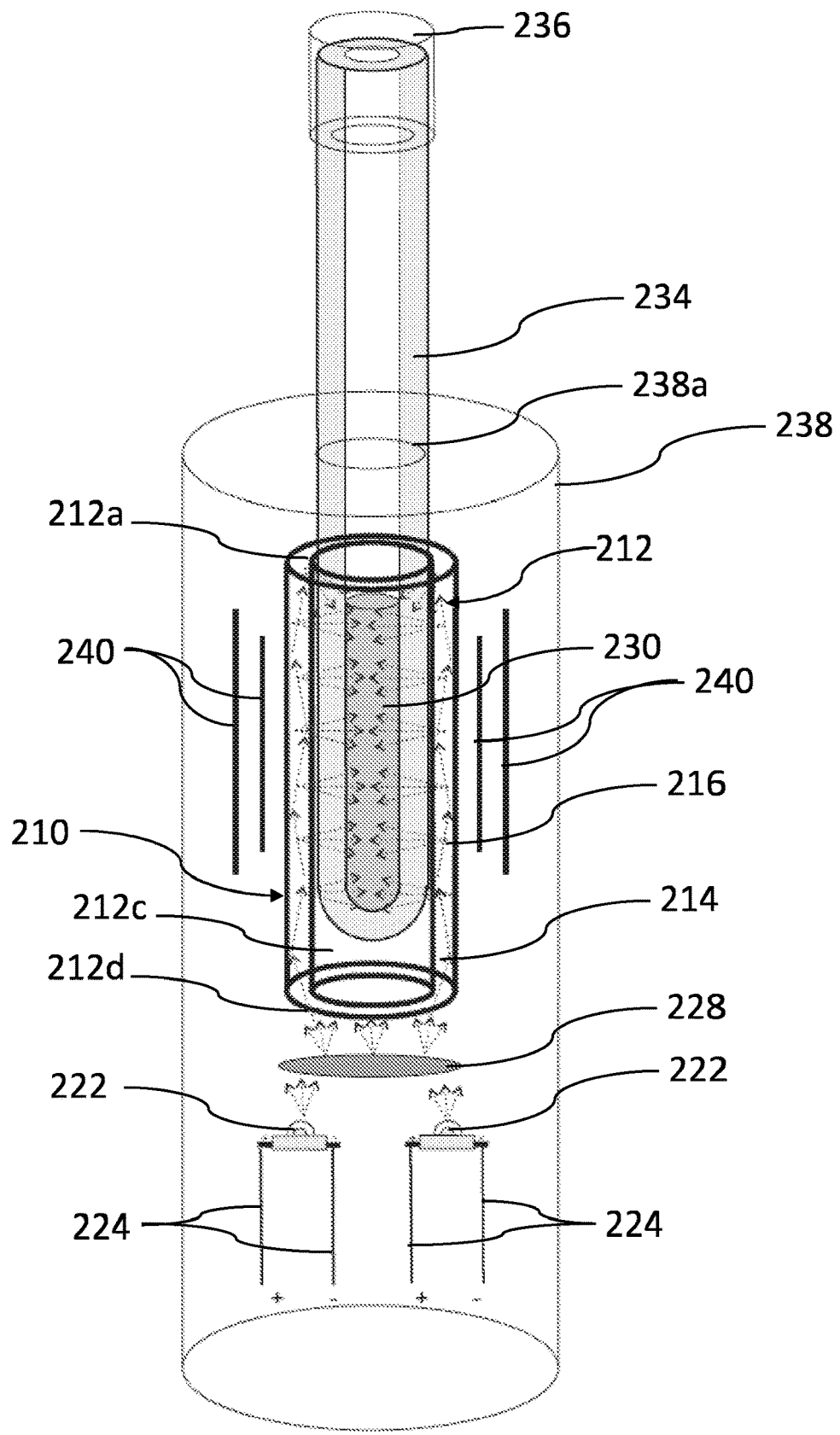
FIG. 4 shows an illumination insert in accordance with an alternative embodiment of the present invention.

An illumination insert 210 in accordance with an alternative embodiment of the present invention is shown in FIG. 4. The illumination insert 210 of FIG. 4 shares many features with the illumination insert 10 described above with reference to FIGS. 1 and 2 and the illumination insert 110 described above with reference to FIG. 3. Like features are indicated using reference numerals transposed by 200 relative to the embodiments of FIGS. 1 and 2.

The main body 212 of the embodiment of FIG. 4 is formed as a tube having a first open end 212a and a second open end 212d. That is, the tube 212 is a hollow cylinder having a through bore 212c (as opposed to the blind bore of the tubes of the embodiments described above). As such, whilst the bore 212c provides a volume that may receive the sample 230, the sample 230 cannot be solely contained by the tube 212. Rather, the bore 212c of the tube 212 may receive a sample holder 234 that contains the sample 230 therein. A sample holder cap 236 may be provided to seal the sample 230 within the sample holder 234. The sample holder cap 236 may be non-transparent in embodiments in which light transmission therethrough is not required (such as the embodiment shown in FIG. 4).

The tube 212 comprises a light guide portion 214 and a diffuser portion 216, consistent with the embodiments described above. The diffuser portion 216 is positioned on the tube 212 such that when the sample holder 234 is received in the bore 212c of the tube 212, the sample is proximate to the diffuser portion 216. Moreover, the tube 212 and sample holder 234 are positionable in an NMR probehead housing 238, with the sample holder 234 being inserted in a channel 238a such that the diffuser portion 216 and the sample 230 are disposed proximate radiofrequency coils 240 of the NMR probehead housing 238. In the embodiment illustrated in FIG. 4, the coils 240 are disposed outside of the tube 212. In certain other embodiments, the tube 212 may be arranged relative to the sample holder 234 such that the coils 240 may reside between the tube 212 and the sample holder 234 in use.

A pair of light sources 222 are provided below the tube 212 so that light is transmitted into the walls of the tube 212 through the second open end 212d. An intermediate light transmission component 228 may direct the light to the desired optical entry point of the tube 212.

In certain embodiments, the tube 212 is provided with a reflective outer coating that serves to improve the light-containing properties of the tube 212 and assist internal reflection. Alternatively or additionally, the top surfaces of the walls at the first open end 212a may be provided with a reflective coating so that any light reaching this part of the tube 212 is reflected back towards the sample 230.

The illumination insert 210 may remain within the NMR probehead housing 238 once it is assembled (e.g. embedded) therein.

As is shown in FIG. 4, the illumination insert 210 does not comprise a housing. Indeed, in certain embodiments (such as the one shown in FIG. 4), a housing may not be provided. In the embodiment of FIG. 4, the various components on the illumination insert 210 are arranged relative to one another by virtue of them being embedded in the NMR probehead housing 238.

Figure 5:
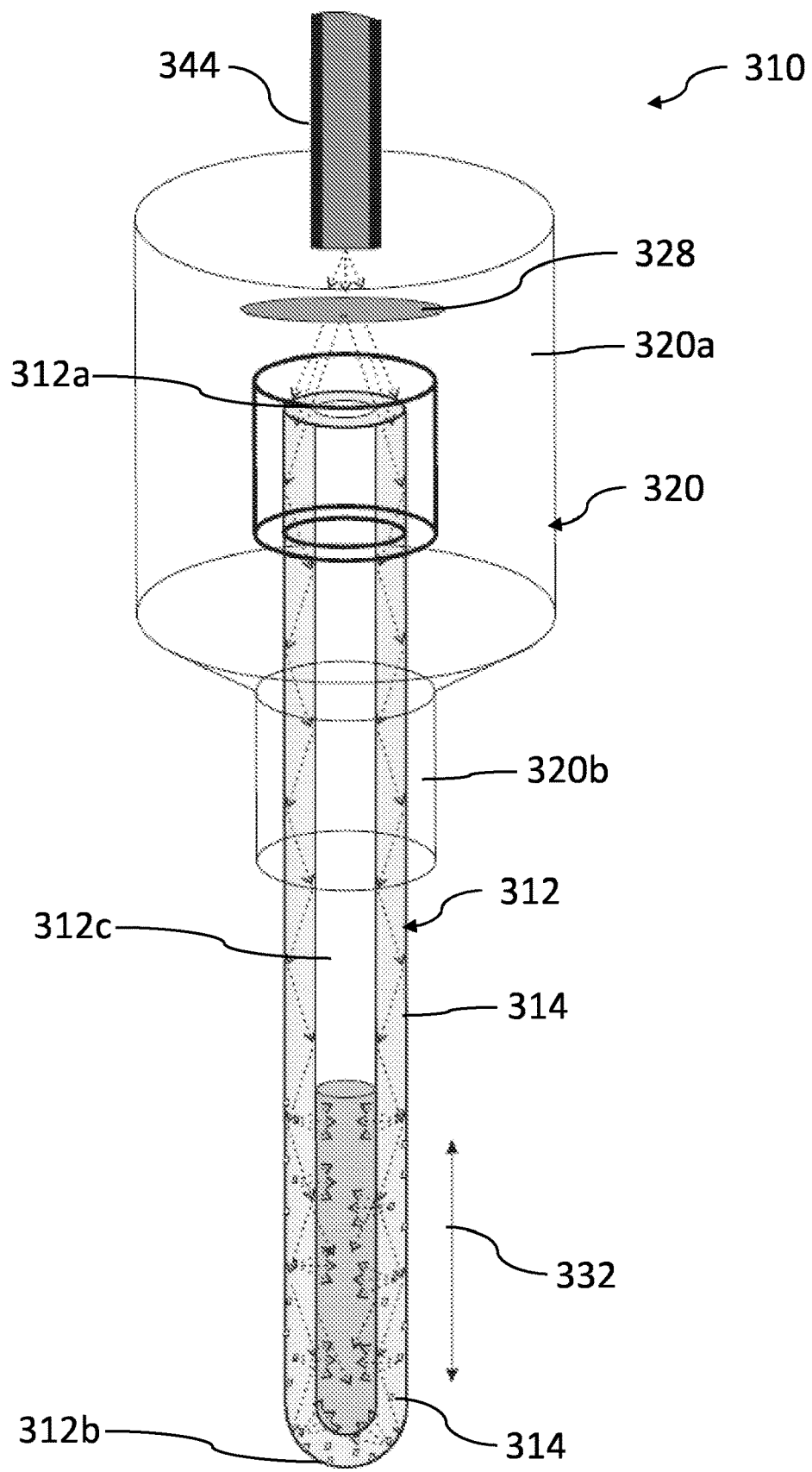
FIG. 5 shows an illumination insert in accordance with an alternative embodiment of the present invention.

An illumination insert 310 in accordance with an alternative embodiment of the present invention is shown in FIG. 5. The illumination insert 310 of FIG. 5 shares many features with the illumination insert 10 described above with reference to FIGS. 1 and 2, and the illumination insert 110 described above with reference to FIG. 3. Like features are indicated using reference numerals transposed by 300 relative to the embodiments of FIGS. 1 and 2.

The illumination insert 310 of FIG. 5 is largely identical to the illumination insert 10 of FIG. 1, but for the fact that the illumination insert 310 does not include a light source. Rather, an auxiliary light guide 344 is provided to channel light from a remote light source to the tube 312. The auxiliary light guide 344 may comprise an optical fibre or other means for transmitting light from a remote light source to the tube 312. The remote light source may be one or more LEDs, laser diodes or lasers, for example. In embodiments having a remote light source, the light source may be positioned far away from the magnet of the NMR spectrometer so as to reduce any effect the light source may have on the magnetic field produced by the magnet, allowing use of light sources containing magnetic materials, such as specialised or stationary lasers.

The skilled reader will appreciate that any of the above described features are not necessarily exclusive to the particular embodiment described. Indeed, the above described features may be combined in any suitable combination in order to form alternative embodiments within the scope of the present invention.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. An illumination insert for an NMR spectrometer, the illumination insert comprising a main body in the form of a tube shaped to receive a sample, the main body comprising:
   a light guide portion for guiding light from a light source; and
   a diffuser portion for diffusing light received from the light guide portion towards the sample received in the tube.

2. An illumination insert according to claim 1, wherein the main body is a unitary component.

3. An illumination insert according to claim 1, wherein the tube has an open end, a closed end and a bore in which the sample may be received.

4. An illumination insert according to claim 3, comprising a cap which seals the open end of the tube, wherein optionally the cap is transparent.

5. An illumination insert according to claim 1, wherein the illumination insert is shaped to receive a sample holder, wherein the sample holder may contain a sample.

6. An illumination insert according to claim 5, wherein the tube has a first open end, a second open end and a through bore therethrough, wherein the sample holder containing the sample may be received within the through bore.

7. An illumination insert according to claim 1, configured such that the diffuser portion is positionable in an NMR detection region proximate to radiofrequency coils of an NMR spectrometer when the illumination insert is inserted in the NMR spectrometer.

8. An illumination insert according to claim 1, comprising a housing that houses at least part of the light guide portion or the diffuser portion.

9. An illumination insert according to claim 8, wherein the housing comprises a non-magnetic material, optionally wherein the non-magnetic material is aluminium or copper.

10. An illumination insert according to claim 8, wherein the housing is configured to locate the illumination insert in the NMR spectrometer.

11. An illumination insert according to claim 1, wherein the main body comprises a reflective coating for improving internal reflection in the main body.

12. An illumination insert according to claim 1, further comprising one or more light sources for providing light to the light guide portion.

13. An illumination insert according to claim 12, wherein the one or more light sources comprise one or more of a light emitting diode, a laser, or a laser diode.

14. An illumination insert according to claim 1, comprising an auxiliary light guide for guiding light from a remote light source towards the light guide portion.

15. An illumination insert according to claim 1, comprising one or more intermediate light transmission components for facilitating transmission of light to the light guide portion.

16. An illumination insert according to claim 15, wherein the one or more intermediate light transmission components focus light towards the light guide portion.

17. An illumination insert according to claim 1, comprising one or more reflectors for reflecting light towards the light guide portion.

18. An illumination insert according to claim 1, wherein the diffuser portion comprises a plurality of light scattering centres that scatter light so as to collectively diffuse light received from the light guide portion towards the sample received in the tube.

19. An illumination insert according to claim 18, wherein the plurality of light scattering centres are provided within the diffuser portion or on a surface of the diffuser portion.

20. An illumination insert according to claim 18, wherein the plurality of light scattering centres comprise a plurality of defects, optionally wherein the plurality of defects comprise a plurality of grooves, indents and/or scratches.

21. An illumination insert according to claim 18, wherein the plurality of light scattering centres are distributed non-uniformly in and/or on the diffuser portion.

22. An illumination insert according to claim 1, comprising a heat sink for facilitating the transfer of heat away from the light source.

23. An illumination insert according to claim 1, in which the illumination insert is in the NMR spectrometer.

24. An NMR probehead housing comprising an illumination insert, the illumination insert comprising a main body in the form of a tube having a first open end, a second open end and a through bore therethrough, wherein a sample holder may be received within the through bore, and the main body comprises:
    a light guide portion for guiding light from a light source; and
    a diffuser portion for diffusing light received from the light guide portion towards a sample received in the illumination insert.

25. An NMR probehead housing according to claim 24, comprising radiofrequency coils disposed radially outward of the tube.

26. An NMR probehead housing according to claim 25, wherein the radiofrequency coils are disposed proximate to the diffuser portion.

27. An NMR probehead housing according to claim 24, comprising a sample holder received within the through bore and radiofrequency coils disposed between the tube and the sample holder, proximate the diffuser portion.

* * * * *